United States Patent [19]

Tesch et al.

[11] Patent Number: 5,015,887
[45] Date of Patent: May 14, 1991

[54] A-B BUFFER CIRCUIT WITH TTL COMPATIBLE OUTPUT DRIVE

[75] Inventors: Bruce J. Tesch, Melbourne; Jay D. Moser, Sr., Palm Bay; Stephen P. Tam, Indialantic, all of Fla.

[73] Assignee: Harris Corporation, Melbourne, Fla.

[21] Appl. No.: 431,517

[22] Filed: Nov. 3, 1989

[51] Int. Cl.⁵ .................... H03K 17/16; H03L 3/26
[52] U.S. Cl. .............................. 307/475; 307/443; 307/455
[58] Field of Search ............ 307/475, 443, 496, 455

[56] References Cited

U.S. PATENT DOCUMENTS 3,610,962 10/1971 Keene et al. .................. 307/261
4,897,560 1/1990 Saito et al. .................. 307/296.3

Primary Examiner—David Hudspeth
Assistant Examiner—Andrew Sanders
Attorney, Agent, or Firm—Evenson, Wands, Edwards, Lenahan & McKeown

[57] ABSTRACT

A single supply, TTL-compatible, class A-B signal buffer architecture comprises a multistage emitter-follower transistor circuit that is coupled between an input terminal and an output terminal capable of sinking and sourcing current to TTL specifications. A reference emitter-follower transistor stage is coupled in parallel with one of the emitter-follower transistor stages of the multistage emitter-follower transistor circuit, and a common emitter, current control transistor stage has its emitter-collector path coupled between the output terminal and ground for controlling the operation of the multistage emitter-follower transistor circuit. A differential amplifier stage, one arm of which is used to controllably forward bias the base-emitter junction of the current control transistor, has a first input coupled to the reference emitter-follower transistor stage and a second input coupled to the one emitter-follower transistor stage of the multistage emitter-follower transistor circuit. The control arm of the differential amplifier contains a voltage-dropping load impedance, to which the base of the current control transistor is coupled. A further, voltage-referenced emitter-follower provides a prescribed minimum bias voltage across the load impedance, so as to maintain the current controlling, common emitter transistor stage to be continuously conductive, so that cross-over distortion in the output signal is minimized.

22 Claims, 2 Drawing Sheets

CLASS A-B BUFFER WITH TTL COMPATIBLE OUTPUT DRIVE

A-B BUFFER CIRCUIT WITH TTL COMPATIBLE OUTPUT DRIVE

This invention was made with Government support under Contract No. N00164-85-C-016. The Government has certain rights in this invention.

FIELD OF THE INVENTION

The present invention relates in general to signal coupling circuits and is particularly directed to a class A-B buffer having reduced quiescent power consumption.

1. BACKGROUND OF THE INVENTION

Signal coupling circuits which interface with TTL components customarily require the use of multiple power supply rails (exclusive of ground) and, consequently, are not readily incorporated with other signal processing architectures, such as CMOS and ECL designs. For example, in certain applications it is desirable to have a single supply operational amplifier that can also be used as a voltage comparator. A standard push-pull output stage cannot attain a TTL low level using only a single supply. Conversely, the output of a TTL 'totem pole' stage will not operate in a linear, push-pull manner. Previous attempts to address this 'TTL compatibility' problem have involved the incorporation of JFETs, which adds complexity and expense to the manufacturing process, or the use of a 'power draining' load resistor tied to ground.

2. SUMMARY OF THE INVENTION

In accordance with the present invention, these design complexity and power consumption drawbacks are obviated by a new and improved class A-B signal buffer architecture that operates from a standard +5 V TTL supply having an all NPN-output stage and requiring only a complementary BJT manufacturing process. For this purpose, the present invention comprises a multistage emitter-follower transistor circuit that is coupled between an input terminal, to which an input signal to be coupled or interfaced with downstream circuitry (which may be linear) is applied, and an output terminal capable of driving to TTL specifications. A reference emitter-follower transistor stage is coupled in parallel with one of the emitter-follower transistor stages of the multistage emitter-follower transistor circuit, and a common emitter, current control transistor stage has its emitter-collector path coupled between the output terminal and a reference voltage terminal (ground) for controlling the operation of the multistage emitter-follower transistor circuit.

A differential amplifier stage, one arm of which is used to controllably forward bias the base-emitter junction of the current control transistor, has a first input coupled to the reference emitter-follower transistor stage and a second input coupled to the one emitter-follower transistor stage of the multistage emitter-follower transistor circuit. The control arm of the differential amplifier contains a voltage-dropping load impedance, to which the base of the current control transistor is coupled. A further, voltage-referenced emitter follower provides a prescribed minimum bias voltage across the load so as to maintain the current controlling, common emitter transistor stage, and thereby the one emitter-follower transistor stage, to be continuously conductive (irrespective of variations in the input signal), so that cross-over distortion in the output signal is minimized.

In order to establish the quiescent current in the output stage, the reference emitter-follower transistor stage, which is coupled in parallel with the one emitter-follower transistor stage, is biased at a small current by means of a current source connected to its emitter. The difference in base-emitter voltages between the one emitter-follower transistor stage and the reference emitter-follower transistor stage determines the differential input voltage to the differential amplifier. By virtue of the feedback loop through the current control transistor, the differential amplifier biases the current control transistor, and therefore the one emitter-follower transistor, so as to maintain the forward base-emitter voltages of the one and the reference transistor the same. The magnitude of the resulting quiescent current that flows through the common emitter control transistor (typically on the order of several hundred microamps) is considerably less than that (e.g. five milliamps) of a class A approach. The magnitude of the quiescent current is preferably established by the ratio of the emitter area of the one emitter-follower transistor and the reference emitter-follower transistor, to which the inputs of the differential amplifier are coupled.

During active, dynamic operation, the common emitter, current control transistor is effectively modulated by output current demand. As output current begins to flow into the buffer, a corresponding change in output voltage occurs. This $\Delta V_{out}$ is applied to the differential amplifier stage which modulates the current control transistor so as to restore $V_{out}$ and maintain bias current in the one emitter-follower transistor. As output current begins to flow out of the buffer, a corresponding change $\Delta V_{out}$ in output voltage occurs. This $\Delta V_{out}$ is applied to the differential amplifier stage which attempts to modulate the current control transistor off as the output current exceeds the quiescent current. At this point, the further voltage-referenced emitter-follower clamps the base of the current control transistor and maintains this transistor on at a very small current ($10\mu A$ typically), which minimizes crossover distortion.

DETAILED DESCRIPTION

Figure 1:
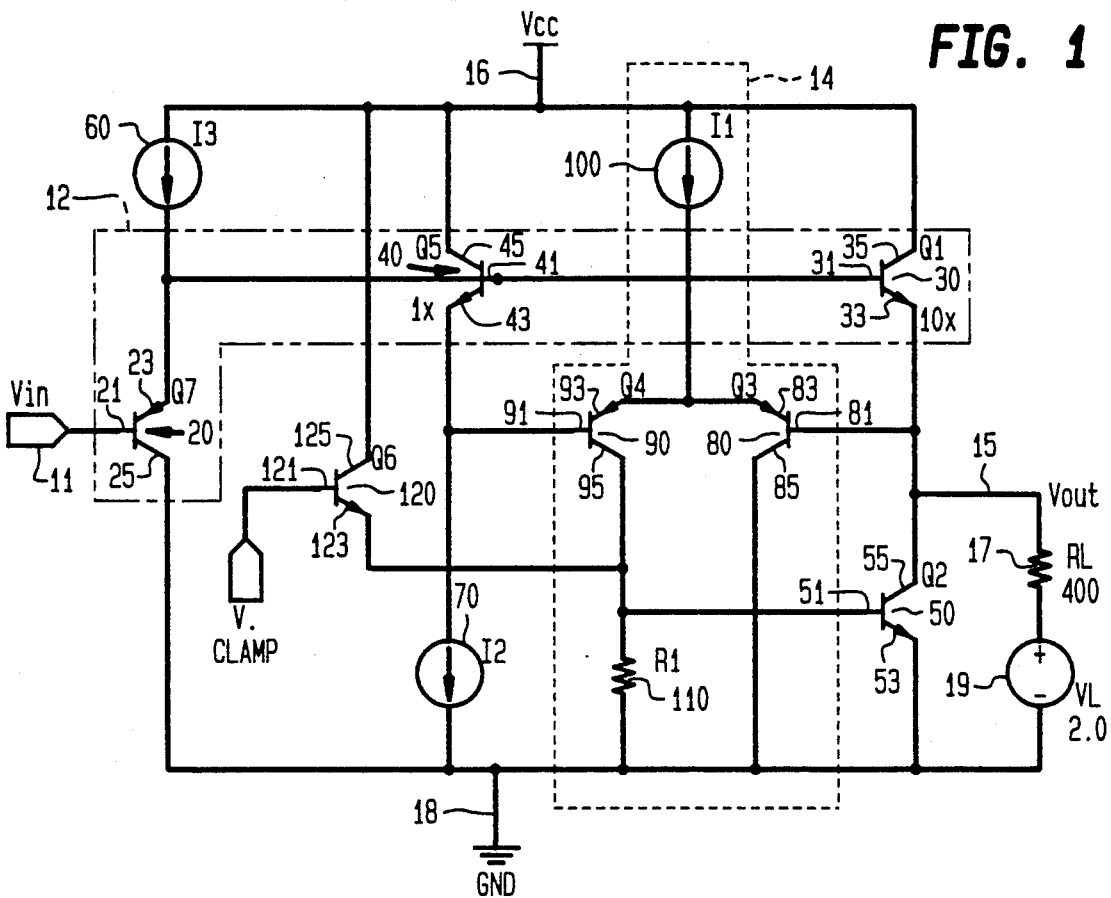
FIG. 1 is a schematic diagram of a class A-B buffer circuit in accordance with a preferred embodiment of the present invention.

Referring now to FIG. 1, a schematic diagram of a class AB buffer circuit in accordance with a preferred embodiment of the present invention is shown as comprising an input terminal 11 to which an input signal (for example, that supplied from an upstream CMOS or ECL-based source) is applied. Input terminal 11 is coupled to the base 21 of a first PNP emitter-follower transistor 20 of a multistage emitter-follower transistor circuit, demarcated by broken lines 12. (It will be readily appreciated that the polarity of PNP transistor 20 and those of the other transistors of FIG. 1 may be reversed with a corresponding change in voltage polarities.) Multistage emitter-follower transistor circuit 12 further includes parallel-connected output NPN emitter-follower transistor 30 and reference NPN emitter follower transistor 40, the ratio (e.g. 10:1) of the areas of the respective emitters 33 and 43 of which sets the ratio of their emitter currents (e.g. 100 microamps to 10 microamps, quiescent) in this example. The respective bases 31 and 41 of transistors 30 and 40 are coupled in common with the emitter 23 of PNP transistor 20.

Output terminal 15, which is capable of driving TTL components, is further coupled to the collector 55 of an NPN common emitter, current control transistor 50. Output terminal 15 is shown as being coupled through a resistive load 17 to an output bias supply 19 referenced to ground. For a TTL Vcc supply voltage of five volts, supply 19 may be set to two volts, so as to reference the quiescent D.C. level of output terminal 15 at a point midway between ground terminal 18 and the maximum positive output voltage range of the circuit ($\approx V_{cc}-1$ V)

The respective collectors 35 and 45 of transistors 30 and 40 are coupled to a power supply (Vcc) terminal 16. The collector 25 of emitter follower transistor 20 and the emitter 53 of current control transistor 50 are coupled to ground terminal 18. A first current source 60 is coupled between terminal 16 and the emitter 23 of transistor 20, while a second current source 70 is coupled between the emitter 43 of reference emitter-follower transistor 40 and ground terminal 18.

A differential amplifier stage, shown in dotted lines 14, serves to provide feedback to maintain the output voltage Vout at terminal 15 equal to the input voltage Vin at input terminal 11. Differential amplifier stage 14 includes a matched pair of PNP transistors 80 and 90, the respective emitters 83 and 93 of which are coupled to a third current source 100, from the high (Vcc) supply terminal 16, and the respective bases 81 and 91 of which are coupled to emitters 33 and 43 of emitter-follower transistors 30 and 40. The collector 85 of transistor 80 is coupled directly to ground terminal 18, while the collector 95 of transistor 90 is coupled to ground terminal 18 through a voltage-dropping resistor 110. The output of current source 100 is proportional to $V_{be}$ such that the voltage drop across resistor 110 tracks $V_{be50}$ with temperature. The voltage drop across resistor 110 is used to controllably forward bias the base-emitter junction of current control transistor 30.

For this purpose, resistor 110 is coupled to the base 51 of transistor 50 and to the emitter 123 of a voltage-referenced emitter-follower transistor 120. The collector 125 of transistor 120 is coupled to Vcc terminal 16, while its base 121 is "clamped" to a prescribed voltage that effectively maintains transistor 120 in a 'slightly off' quiescent condition. When current flowing from the emitter 33 of transistor 30 out of the buffer exceeds the quiescent level, differential amplifier 14 attempts to modulate transistor 50 off. At this point, the base voltage of transistor 50 is "clamped" by transistor 120, which turns on in response to the slight drop in base voltage of transistor 50. This maintains current control transistor 50 continuously conductive, so that crossover distortion in the output signal is minimized.

The buffer of the present invention operates as follows. During quiescent or standby conditions, emitter-follower output transistor 30 is biased on, and the output voltage at output terminal 15 matches the input voltage at input terminal 11. Under these conditions, the voltage seen by each of the inputs of differential amplifier 14 (the emitter voltages at emitters 33 and 43 of transistors 30 and 40, respectively) is the same, so that the circuit is balanced, and that the output current at the emitter 33 of emitter-follower transistor 30 is simply the product of the ratio of its emitter area to that of reference transistor 40 and the magnitude of the current from current source 70 (e.g. $10 \times I_{70}$). The voltage at the emitter 123 of transistor 120 is sufficient to cause transistor 120 to be just slightly off ($I_c<1\mu A$) so that clamp transistor 120 is not affecting the circuit.

Figure 2:
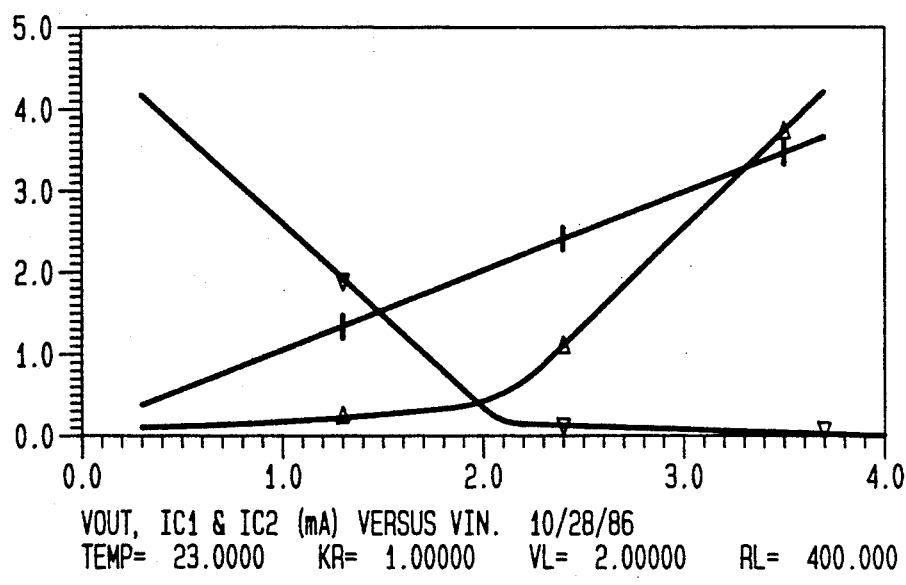
FIGS. 2–4 show transfer functions associated with the operation of the buffer circuit of FIG. 1.
Figure 3:
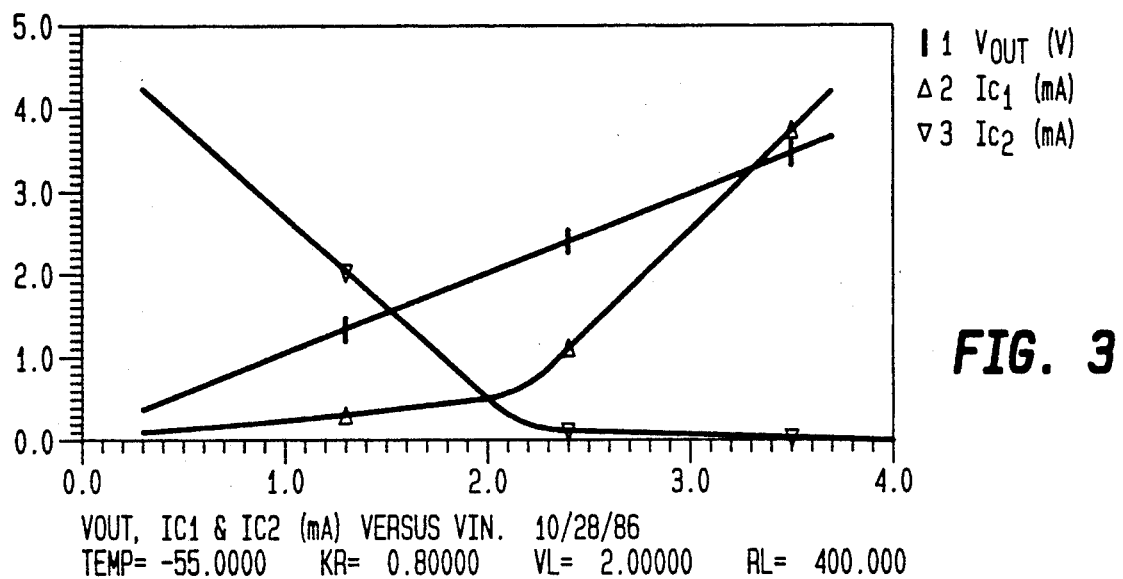
Figure 4:
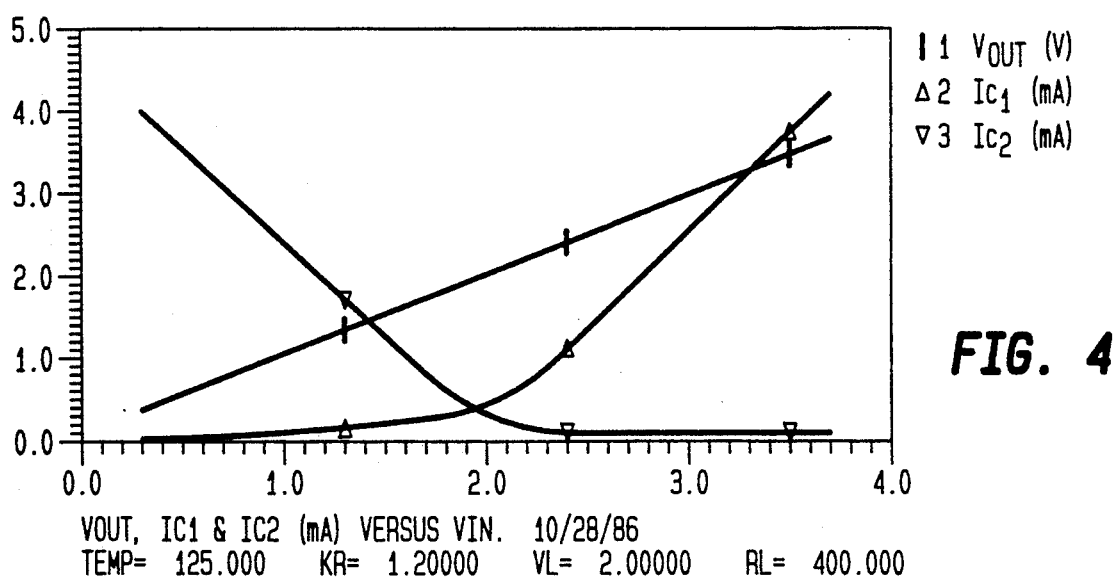

During dynamic conditions (transfer functions for which, showing variations in output terminal voltage Vout, current IC1 through transistor 30 and current IC2 through transistor 50 versus input voltage Vin, are shown in FIGS. 2-4), when current flows from output 15 into the load 17, the forward base-emitter voltage drop $V_{be30}$ of output transistor 30 increases. This increase thereby boosts the drive to base 81 of transistor 80 and turning on transistor 80 harder. As transistor 80 thus draws more current, it diverts current from differential amplifier current source 100 away from matched transistor 90, so that the collector current from transistor 90 into load resistor 110 is decreased, thereby lowering the voltage drop across resistor 110 and decreasing the base drive to current control transistor 50. In order to prevent transistor 50 from turning completely off, which would undesirably increase cross-over distortion, voltage referenced transistor 120 turns on to maintain a minimum voltage across resistor 110, and keeps current control transistor 50 slightly on.

Conversely, when current flows into output 15 from the load 17, the forward base-emitter voltage drop $V_{be30}$ of output transistor 30 decreases, thereby decreasing the drive to base 81 of transistor 80. As transistor 80 thus draws less of the current supplied by source 100, the current flow through transistor 90 increases and into load resistor 110 is increased. The increased drop across resistor 110 increases the base drive to current control transistor 50, so that transistor 50 sinks more of the current supplied from the load while maintaining quiescent current in transistor 30. This feedback drive of current control transistor 50 permits the output terminal 15 to be pulled down to within $V_{CE50}(SAT)$ of voltage reference terminal 18.

As will be appreciated from the foregoing description, the design complexity and output drive limitation drawbacks of conventional single supply, TTL-compatible buffer circuits are obviated in accordance with the class A-B signal buffer architecture of the present invention which operates with a low standby current and is capable of meeting TTL output drive specifications.

While we have shown and described an embodiment in accordance with the present invention, it is to be understood that the same is not limited thereto but is susceptible to numerous changes and modifications as known to a person skilled in the art, and we therefore do not wish to be limited to the details shown and described herein but intend to cover all such changes and modifications as are obvious to one of ordinary skill in the art.

What is claimed:

1. A signal coupling circuit comprising:
   an input terminal to which an input signal is coupled;
   an output terminal from which an output signal is derived;
   a multistage emitter-follower transistor circuit coupled between said input and output terminals;
   a current control transistor stage coupled to said output terminal for controlling the operation of said multistage emitter-follower transistor circuit;
   a reference emitter-follower transistor stage coupled in parallel with one of the emitter-follower transistor stages of said multistage emitter-follower transistor circuit;

a differential amplifier stage having a first input coupled to said reference emitter-follower transistor stage and a second input coupled to said one of the emitter-follower transistor stages of said multistage emitter-follower transistor circuit, and a load impedance, to which said current control transistor stage is coupled; and means for providing a prescribed bias current through said load impedance, so as to cause said current control transistor stage, and thereby said one of the emitter-follower transistor stages of said multistage emitter-follower transistor circuit, to be continuously conductive, irrespective of variations in said input signal.

2. A signal coupling circuit according to claim 1, wherein said one emitter-follower transistor stage has an emitter area that is a multiple of the emitter area of said reference emitter-follower transistor stage.

3. A signal coupling circuit according to claim 1, wherein said current control transistor stage comprises a common emitter transistor stage, the base of which is coupled to said load impedance and the emitter-collector path of which is coupled in circuit with the collector-emitter current path of said one emitter-follower transistor stage.

4. A signal coupling circuit according to claim 3, wherein said prescribed potential providing means comprises a further emitter-follower transistor stage, the collector-emitter path of which is coupled in circuit with said load impedance, and the base of which is clamped at a fixed reference potential.

5. A signal coupling circuit according to claim 1, wherein said prescribed potential providing means comprises means for maintaining a prescribed minimum voltage drop across said load impedance sufficient to continuously forward bias the base-emitter junction of said current control transistor stage.

6. A signal coupling circuit according to claim 1, wherein said one emitter-follower transistor stage and said current control transistor stage are of the same polarity type.

7. A signal coupling circuit according to claim 1, further including a first current source coupled in circuit with said differential amplifier and a second current source coupled in circuit with said reference emitter-follower transistor stage.

8. A signal coupling circuit according to claim 7, wherein said multistage emitter-follower transistor circuit includes an input emitter-follower transistor stage, the base of which is coupled to said input terminal, the emitter of which is coupled to the base of said one of the emitter-follower transistor stages, and the emitter-collector path of which is coupled in circuit with a third current source.

9. A signal coupling circuit comprising:
an input terminal to which an input signal is coupled;
an output terminal from which an output signal is derived;
a first emitter-follower transistor stage, the base of which is coupled to said input terminal and the collector-emitter path of which is coupled in circuit between first and second power supply terminals;
a differential amplifier stage, having first and second inputs and a load impedance coupled in one arm thereof, coupled in circuit between said first and second power supply terminals;

a second emitter-follower transistor stage, the base of which is coupled to the emitter of said first emitter-follower stage and the collector-emitter path of which is coupled i-n circuit between first and second power supply terminals;
a third emitter-follower transistor stage, the base of which is coupled to the emitter of said first emitter-follower stage;
a common emitter transistor stage, the base of which is coupled to said load impedance, and the collector-emitter path of which is coupled in circuit with the collector-emitter path of said third emitter-follower transistor stage between said first and second supply terminals; and wherein
the first and second inputs of said differential amplifier are coupled to the emitters of said second and third emitter-follower transistor stages, respectively, and the collector of said common emitter transistor stage is coupled to said output terminal.

10. A signal coupling circuit according to claim 9, further including means for applying a prescribed minimum bias voltage across said load impedance, so as to cause said common emitter transistor stage, and thereby said third emitter-follower transistor stage to be continuously conductive, irrespective of variations in said input signal.

11. A signal coupling circuit according to claim 10, wherein said third emitter-follower transistor stage has an emitter area that is a multiple of the emitter area of said second emitter-follower transistor stage.

12. A signal coupling circuit according to claim 10, wherein said prescribed bias current applying means comprises a fourth emitter follower-transistor stage, the collector-emitter path of which is coupled in circuit with said load impedance, and the base of which is clamped at a fixed reference potential.

13. A signal coupling circuit according to claim 10, wherein said prescribed bias voltage applying means comprises means for maintaining a prescribed minimum voltage drop across said load impedance sufficient to continuously forward bias the base-emitter junction of said common emitter transistor stage.

14. A signal coupling circuit according to claim 10, wherein said third emitter-follower transistor stage and said common emitter transistor stage are of the same polarity type.

15. A signal coupling circuit according to claim 10, further including a first current source coupled in circuit with said differential amplifier between said first and second power supply terminals, and a second current source coupled in circuit with said second emitter-follower transistor stage between said first and second power supply terminals.

16. A signal coupling circuit according to claim 15, further including a third current source coupled in circuit with said first emitter-follower transistor stage between said first and second power supply terminals.

17. A signal coupling circuit according to claim 10, further including means for setting the quiescent voltage of said output terminal at a preselected voltage lying between the respective voltages of said first and second power supply terminals.

18. A signal coupling circuit comprising:
an input terminal to which an input signal is coupled;
an output terminal from which an output signal is derived;
a multistage emitter-follower transistor circuit coupled between said input and output terminals;

a reference emitter follower transistor stage coupled in parallel with one of the emitter-follower transistor stages of said multistage emitter-follower transistor circuit;

a differential amplifier stage having a first input coupled to said reference emitter-follower transistor stage and a second input coupled to said one of the emitter-follower transistor stages of said multistage emitter-follower transistor circuit; and a current control transistor stage, coupled to said output terminal and to said differential amplifier stage, for controllably enabling said output terminal to source or sink current in a manner that is dependent on the load current at said output terminal, and for causing said one emitter-follower transistor stage to be continuously conductive, irrespective of variations in said input signal.

19. A signal coupling circuit according to claim 18, wherein said current control transistor stage comprises a common emitter transistor stage, the base of which is coupled to said differential amplifier stage and the emitter-collector path of which is coupled in circuit with the collector-emitter current path of said one emitter follower transistor stage.

20. A signal coupling circuit according to claim 19, wherein said differential amplifier stage includes a load impedance coupled in one arm thereof, to which the base of said common emitter transistor stage is coupled, and said current control transistor stage includes means for maintaining a prescribed minimum voltage drop across said load impedance which is sufficient to continuously forward bias the base-emitter junction of said common emitter transistor stage.

21. A signal coupling circuit according to claim 20, wherein said one emitter follower transistor stage and said common emitter transistor stage are of the same polarity type.

22. A signal coupling circuit according to claim 20, further including a first current source coupled in circuit with said differential amplifier stage and a second current source coupled in circuit with said reference emitter follower transistor stage.

* * * * *